(12) United States Patent
Dias et al.

(10) Patent No.: US 7,042,729 B2
(45) Date of Patent: May 9, 2006

(54) THERMAL INTERFACE APPARATUS, SYSTEMS, AND FABRICATION METHODS

(75) Inventors: Rajen C. Dias, Phoenix, AZ (US); Yongmei Liu, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 10/608,519

(22) Filed: Jun. 24, 2003

(65) Prior Publication Data

US 2004/0264138 A1    Dec. 30, 2004

(51) Int. Cl.
*H05K 7/20* (2006.01)

(52) U.S. Cl. .................. 361/708; 165/80.2; 165/185; 257/707; 257/713; 361/707; 361/710; 428/40.9

(58) Field of Classification Search ...... 165/80.2–80.3, 165/185; 174/16.3; 257/706–707, 712–713; 361/687–722; 156/89.24, 247, 250, 346; 428/40.1, 40.2, 40.9, 344; 438/106, 122, 438/137, 354
See application file for complete search history.

(56) References Cited

U.S. PATENT DOCUMENTS

| | | | | |
|---|---|---|---|---|
| 4,482,912 A | * | 11/1984 | Chiba et al. | 257/746 |
| 4,654,754 A | * | 3/1987 | Daszkowski | 361/708 |
| 4,869,954 A | * | 9/1989 | Squitieri | 442/13 |
| 5,323,294 A | * | 6/1994 | Layton et al. | 361/699 |
| 5,783,862 A | * | 7/1998 | Deeney | 257/714 |
| 6,444,496 B1 | * | 9/2002 | Edwards et al. | 438/122 |
| 6,531,770 B1 | * | 3/2003 | Nakashima | 257/704 |

* cited by examiner

*Primary Examiner*—Gregory D Thompson
(74) *Attorney, Agent, or Firm*—Schwegman, Lundberg, Woessner & Kluth, P.A.

(57) ABSTRACT

An apparatus and system, as well as fabrication methods therefor, may include a unitary, substantially uniformly distributed transfer material coupled to a carrier material.

23 Claims, 5 Drawing Sheets

THERMAL INTERFACE APPARATUS, SYSTEMS, AND FABRICATION METHODS

TECHNICAL FIELD

The subject matter relates generally to compositions, apparatus, systems, and methods used to assist in transferring heat from one element or body, such as a circuit or die, to another, such as a heat sink.

BACKGROUND INFORMATION

Electronic components, including integrated circuits, may be assembled into component packages by physically and electrically coupling them to a substrate. During operation, the package may generate heat that can be dissipated to help maintain the circuitry at a desired temperature. Heat sinks, heat spreaders, and other heat dissipating elements may be attached to the package using a suitable thermal interface material.

The interface material, which may take the form of Indium-based solder paste, can be used to attach a copper heat spreader to a die, for example. However, the paste typically includes solder particles of widely variable size, resulting in non-uniform distribution of particles across the die, high thermal resistance, and mechanical stress. Different interface materials, or arrangements of such materials, may operate to improve heat transfer from sources, such as dice, to sinks, such as heat spreaders.

DETAILED DESCRIPTION

Figure 1A:
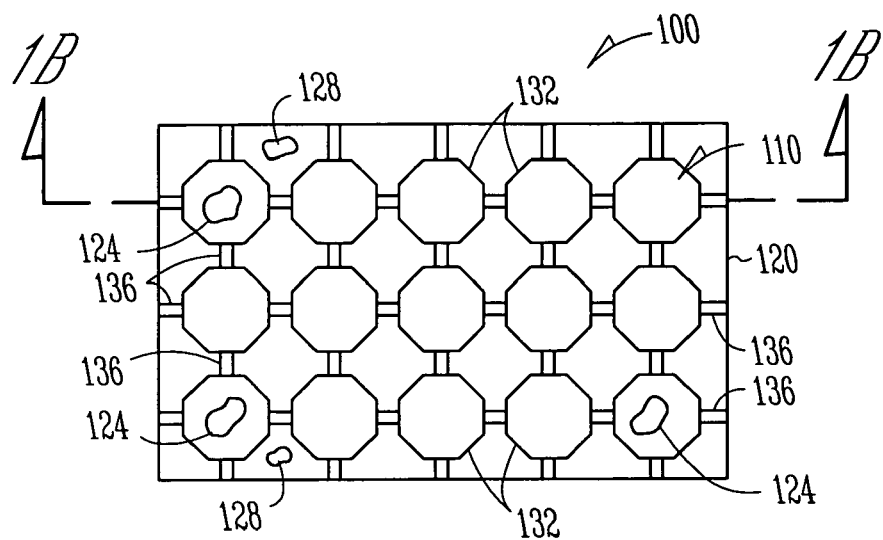
FIGS. 1A and 1B are top cut-away and side cut-away views, respectively, of an apparatus according to various embodiments.

In the following detailed description of various embodiments, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that compositional, structural, electrical, and logical substitutions and changes may be made without departing from the scope of this disclosure. The following detailed description, therefore, is not to be taken in a limiting sense.

Figure 1B:
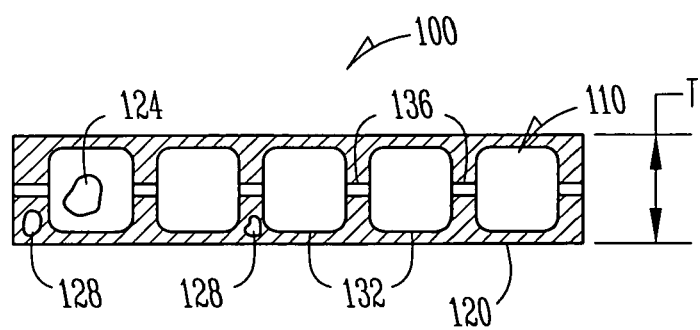

FIGS. 1A and 1B are top and side cut-away views, respectively, of an apparatus 100 according to various embodiments. The apparatus 100 may be used to assist in transferring heat from one element or body, such as a circuit or die, to another, such as a heat sink, for example. The apparatus 100 may comprise a unitary, substantially uniformly distributed transfer material 110 forming a mesh and coupled to a carrier material 120. The unitary, substantially uniformly distributed transfer material 110 may comprise at least one of a component transfer material 124, including bismuth, copper, gold, indium, zinc, antimony, magnesium, lead, silver, tin, and alloys thereof. The carrier material 120 may comprise at least one of a component carrier material 128 including a polymer, an elastomer, a hardener, a catalyst, a reactive diluent, an adhesion promoter, a surfactant, a deforming agent, a fluxing agent, a toughening agent, a coupling agent, an epoxy, an ester, a siloxane, a polyamide, a silicone, a rubber, and a wetting agent.

It should be noted that the component transfer material 124 and the component carrier material 128 are shown as discrete components of the unitary, substantially uniformly distributed transfer material 110 and the carrier material 120, respectively, in FIGS. 1A and 1B. This method of illustration is used so as not to obscure the makeup of the materials 110, 120, but is not meant to limit the use, appearance, form, or combinational mechanisms of the materials 110, 120 in any way.

A plurality of elements 132 may be included in the unitary, substantially uniformly distributed transfer material 110, forming a portion of the mesh. The elements 132 may be distributed in a substantially repetitive pattern, such as a substantially parallel pattern, including a grid pattern (i.e., two substantially parallel patterns juxtaposed to each other in a substantially perpendicular fashion), as shown in FIG. 1A. Thus, the unitary, substantially uniformly distributed transfer material 110 may include elements 132, forming a portion of a mesh, which may in turn comprise a plurality of substantially similar geometric objects, perhaps arranged in a substantially repeating pattern.

The elements, 132, including a plurality of substantially similar geometric objects, may comprise a plurality of regular geometric objects, such as a sphere, a spherical cap, a torus, a rectangular parallelepiped, a cube, a pyramid, a cylinder, a frustrum, an ellipsoid, an elliptic cylinder, an elliptic cone, an elliptic hyperboloid, a paraboloid of revolution, and/or a hyperbolic paraboloid. Alternatively, or in addition, the elements 132, including a plurality of substantially similar geometric objects, may include a plurality of irregular geometric objects, which can be patterned (e.g., figurines, animals, trees, holiday shapes, stars, pillows, twists, wagon wheels, etc.) or unpatterned.

Many of the geometric objects, including combinations of regular and irregular geometric objects (e.g., crab, palm tree, and bird), can be interlocked together or tessellated such that when cut from a single sheet, there is minimal waste. The height, shape, and/or spacing of the plurality of substantially similar geometric objects can be selected based on a desired volume of the unitary, substantially uniformly distributed transfer material 110 within the carrier material 120, and/or a desired thickness T of the apparatus 100.

A plurality of connecting elements 136 included in the unitary, substantially uniformly distributed transfer material 110 may be used to couple the elements 132, including the plurality of substantially similar geometric objects to each other. The plurality of connecting elements 136 may also be arranged in a substantially repeating pattern.

In another embodiment, the apparatus 100 may be described as including a carrier material 120 and a solderable transfer material 110 at least partially embedded within the carrier material 120 and arranged in a substantially uniform fashion. The solderable transfer material 110 may comprises at least one of a component transfer material 124 including bismuth, copper, gold, indium, zinc, antimony, magnesium, lead, silver, tin, and alloys thereof. The solderable transfer material may also comprise a plurality of elements 132, each including one or more substantially similar geometric objects distributed on substantially repeating pattern, such as a substantially parallel pattern, including a grid pattern.

As noted previously, the substantially similar geometric objects may include a plurality of regular geometric objects, and/or a plurality of irregular geometric objects. The apparatus 100 may also comprise a plurality of connecting elements 136 to couple the plurality elements 132, each including one or more substantially similar geometric objects, to each other.

In yet another embodiment, an apparatus 100 may be described as comprising an array 110 of solderable elements 132 coupled to each other by a plurality of solderable connecting elements 136. The apparatus 100 may also include a carrier material 120 coupled to the array 110 of solderable elements 132. The array 110 of solderable elements 132 may be fully or partially embedded in the carrier material 120.

Many choices can be made regarding the size and shape of the solderable elements 132, including selecting an average volume of each one of the plurality of solderable connecting elements 136 to be less than about one-half of the volume of an average size of each one of the solderable elements 132 in the array 110. The height, shape, and/or spacing of the plurality of solderable elements 132, including substantially similar geometric objects, may be selected based on an associated package stress (as described hereinbelow).

Figure 2A:
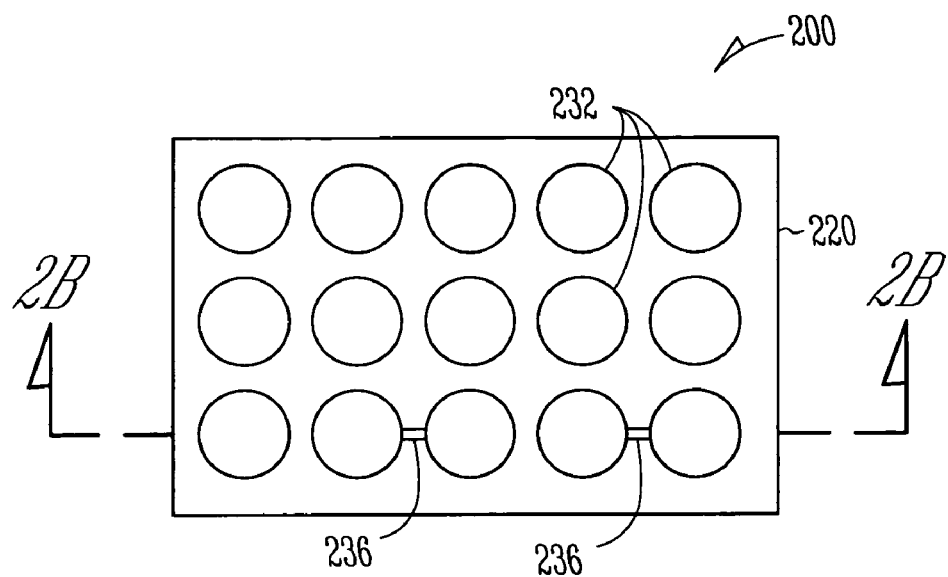
FIGS. 2A and 2B are top cut-away and side cut-away views, respectively, of an apparatus according to various embodiments.
Figure 2B:
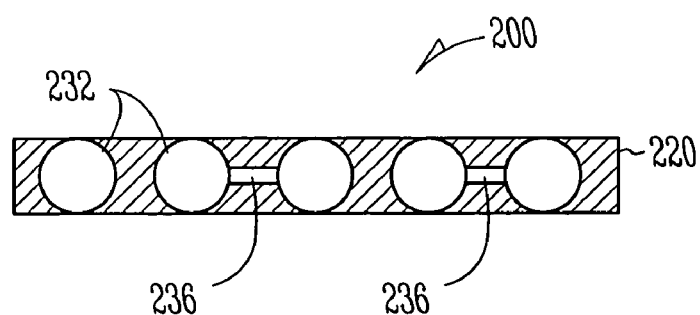
Figure 3:
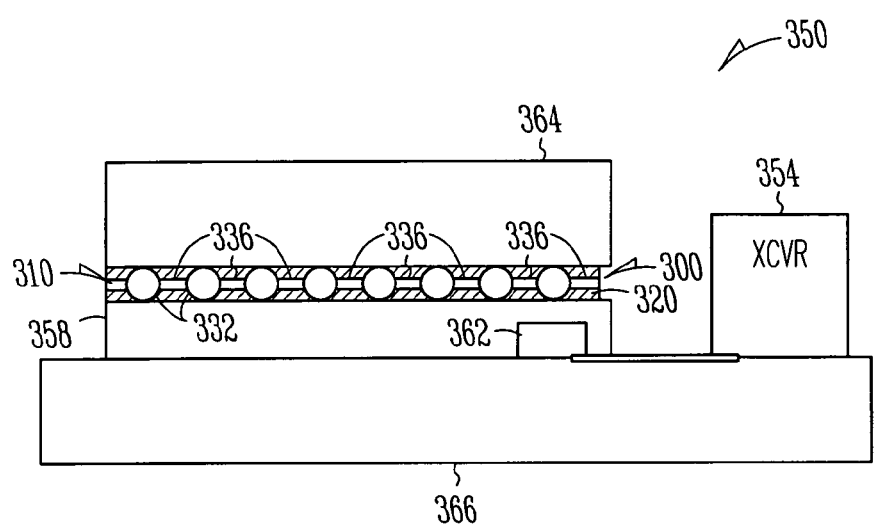
FIG. 3 is a side cut-away view of an apparatus and a system according to various embodiments.

The appearance and arrangement of the apparatus 100 in FIGS. 1A and 1B is shown after manufacture, and before use in various applications. In some embodiments, where the apparatus 100 is applied between a die and a heat spreader for example, a perform cure stage may be used to alter the structure of the apparatus 100. For example, after the apparatus 100 is inserted between a die and a heat spreader, and heat is applied to the combination, the apparatus 100 may appear as shown in FIGS. 2A and 2B, which are top cut-away and side cut-away views, respectively, of an apparatus 200 according to various embodiments. In this case, some or all of the connecting elements 236 may be missing because they have melted due to the application of heat to the apparatus 200, and become incorporated into the elements 232, which in turn have formed flattened spheres (when placed between a die and a heat spreader, for example, as shown in FIG. 3). In fact, selected ones of the connecting elements 236 may be eliminated from the apparatus 200 as desired by the designer and appropriate to a particular application, either during manufacture, or during/after use in a particular application. Thus, in some embodiments, a continuous solder mesh 110 (see FIG. 1A) can be transformed into an array of elements 232, each including one or more solder particles (see FIG. 2A) embedded in a carrier material 220 during a perform cure stage.

Still other embodiments may be realized. FIG. 3 is a side cut-away view of an apparatus 300 and a system 350 according to various embodiments. For example, a system 350 may comprise a wireless transceiver 354, a die 358 including a circuit 362 coupled to the wireless transceiver 354, and a unitary, substantially uniformly distributed transfer material 310 forming a mesh, and coupled to a carrier material 320 and adjacent the die 358.

As noted previously, the plurality of elements 332, including geometric objects, which may be substantially similar, included in the unitary, substantially uniformly distributed transfer material 310 may form a portion of a mesh and be distributed in a substantially repeating pattern. A plurality of connecting elements 336 may be used to couple the plurality of elements 332 included in the unitary, substantially uniformly distributed transfer material 310 to each other. The substantially repeating pattern may comprise a parallel pattern, including a grid pattern.

The system 350 may also comprise a heat dissipating element 364 coupled to the unitary, substantially uniformly distributed transfer material 310. The heat dissipating element 364 may comprise any number of devices, including a heat sink, a peltier cooler, and/or a heat spreader. The die 358 may comprise any kind or amount of circuitry 362 and/or components, including a flip-chip, a processor, one or more power transistors, and/or a memory. The height, shape, and/or spacing of the plurality of elements 332, including objects, such as geometric objects, may be selected based on a package stress associated with the die 358.

The die 358 and the wireless transceiver 354 may be coupled to a substrate 366, which may comprise organic or inorganic materials, or combinations of these. The substrate 366 may also comprise flexible materials and/or nonflexible materials. Materials included in the substrate 366 may be non-conductive or conductive, depending upon the configuration and requirements of the apparatus 300 and system 350.

Figure 4:
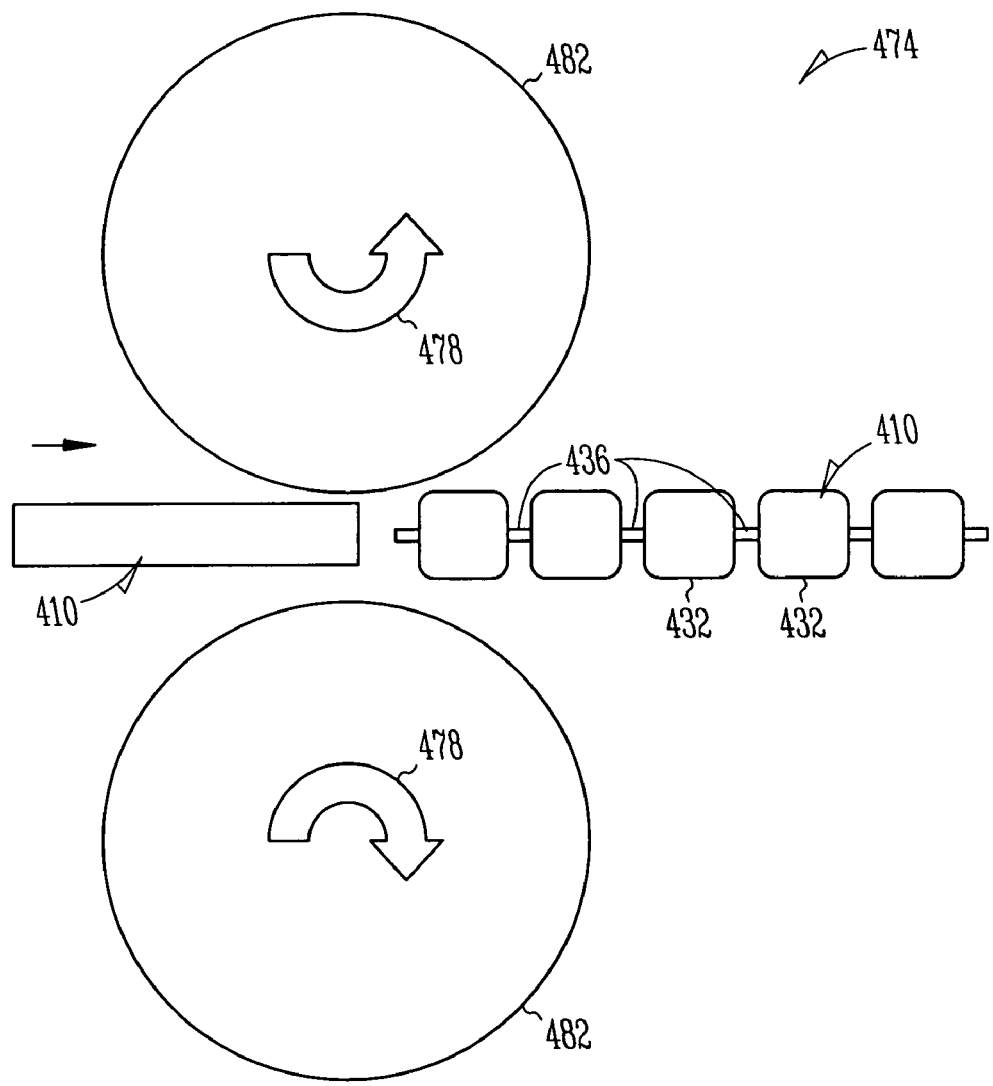
FIG. 4 is a side view of a machine according to various embodiments.

Still other embodiments may be realized. FIG. 4 is a side view of a machine 474 according to various embodiments. The machine 474 may comprise one or more transport elements 478 and a pair of rollers 482, at least one of which is capable of being coupled to a transport element 474. One or more of the rollers 482 may comprise a pattern to form a corresponding pattern in a solderable material 410. The pattern may include an array of elements 432, including geometric objects, arranged in a substantially repetitive manner, including as a plurality of substantially similar geometric objects distributed on a grid pattern, as shown for elements 132 in FIG. 1A. Selected elements 432 included in the array of elements 432 may be interconnected by a plurality of connecting elements 436.

It should also be understood that the apparatus and systems of various embodiments can be used in applications other than for coupling and heat transfer between dice and heat dissipating elements, and thus, the embodiments shown are not to be so limited. The illustrations of apparatus 100, 200, 300, and a system 350 are intended to provide a general understanding of the elements and structure of various embodiments, and they are not intended to serve as a complete description of all the features of apparatus and systems that might make use of the elements and structures described herein.

Applications that may include the novel apparatus and systems of various embodiments include electronic circuitry used in high-speed computers, communication and signal processing circuitry, data transceivers, modems, processor modules, embedded processors, and application-specific modules, including multilayer, multi-chip modules. Such apparatus and systems may further be included as sub-components within a variety of electronic systems, such as televisions, cellular telephones, personal computers, workstations, radios, video players, vehicles, and others.

Figure 5:
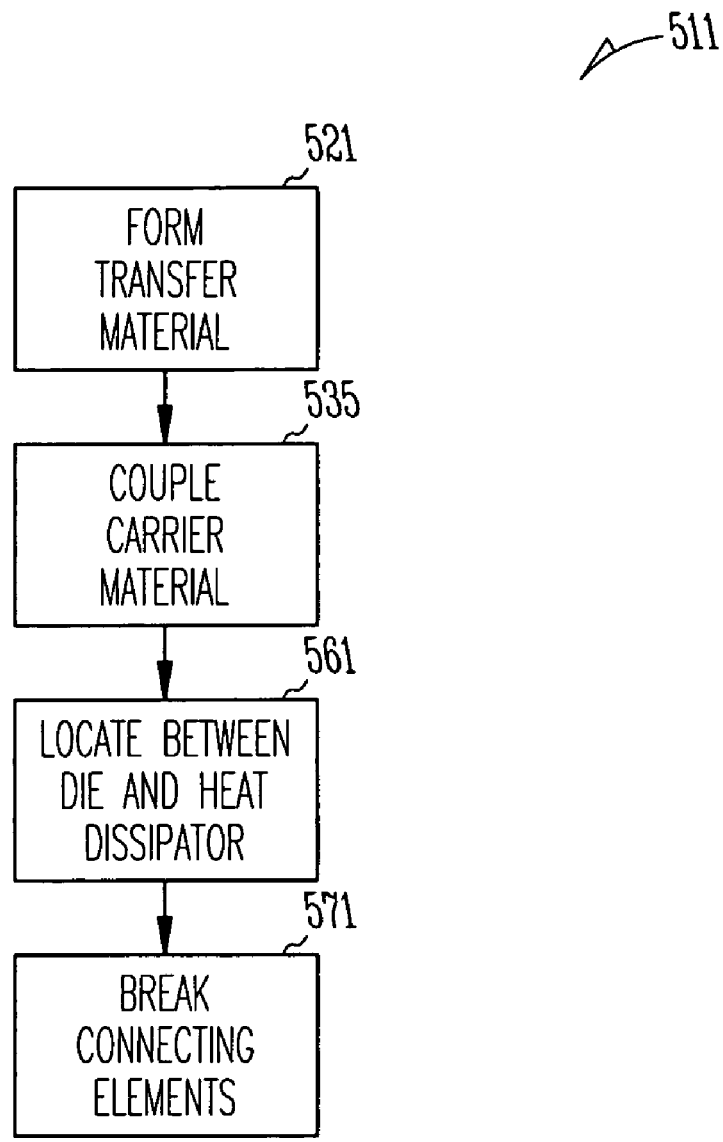
FIG. 5 is a flow chart illustrating several methods according to various embodiments.

Some embodiments include a number of methods. For example, FIG. 5 is a flow chart illustrating several methods according to various embodiments. Thus, a method 511 may (optionally) begin with forming a unitary, substantially uniformly distributed transfer material as a mesh at block 521, and coupling a carrier material to the unitary, substantially uniformly distributed transfer material at block 535.

Forming the unitary, substantially uniformly distributed transfer material as a mesh at block 521 may further comprise impressing at least one patterned roller against a sheet of solderable material. Embossing, printing, laminating and punching may also be used. Coupling the carrier material to the unitary, substantially uniformly distributed transfer material may include curing the carrier material. The carrier material, which may comprise a polymer, may be laminated or coated onto the unitary, substantially uniformly distributed transfer material. Other processes may also be used, such that the unitary, substantially uniformly distributed transfer material is partially or fully embedded in the carrier material.

The method 511 may also include placing the unitary, substantially uniformly distributed transfer material and the carrier material between a die and a heat dissipating element at block 561, and heating the unitary, substantially uniformly distributed transfer material so as to break a selected number of connecting elements coupling a plurality of geometric objects included in the unitary, substantially uniformly distributed transfer material at block 571.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An apparatus, comprising:
   a unitary, substantially uniformly distributed transfer material forming a mesh; and
   a carrier material coupled to the unitary, substantially uniformly distributed transfer material, wherein a plurality of elements included in the unitary, substantially uniformly distributed transfer material are distributed in a substantially repeating pattern.

2. The apparatus of claim 1, wherein the unitary, substantially uniformly distributed transfer material further comprises at least one of a component transfer material including bismuth, copper, gold, indium, zinc, antimony, magnesium, lead, silver, tin, and alloys thereof.

3. The apparatus of claim 1, wherein the carrier material further comprises at least one of a component carrier material including a polymer, an elastomer, a hardener, a catalyst, a reactive diluent, an adhesion promoter, a surfactant, a deforming agent, a fluxing agent, a toughening agent, a coupling agent, an epoxy, an ester, a siloxane, a polyamide, a silicone, a rubber, and a wetting agent.

4. The apparatus of claim 1, further comprising:
   a heat dissipating element coupled to the unitary, substantially uniformly distributed transfer material.

5. An apparatus, comprising:
   a unitary, substantially uniformly distributed transfer material forming a mesh; and
   a carrier material coupled to the unitary, substantially uniformly distributed transfer material, wherein the plurality of elements included in the unitary, substantially uniformly distributed transfer material are distributed on a grid pattern.

6. An apparatus, comprising:
   a unitary, substantially uniformly distributed transfer material forming a mesh; and
   a carrier material coupled to the unitary, substantially uniformly distributed transfer material, wherein the unitary, substantially uniformly distributed transfer material further comprises a plurality of substantially similar geometric objects.

7. The apparatus of claim 6, wherein the plurality of substantially similar geometric objects are arranged in a substantially repeating pattern.

8. The apparatus of claim 7, wherein the substantially repeating pattern comprises a parallel pattern.

9. The apparatus of claim 6, wherein the plurality of substantially similar geometric objects includes a plurality of regular geometric objects.

10. The apparatus of claim 6, wherein the plurality of substantially similar geometric objects includes a plurality of irregular geometric objects.

11. The apparatus of claim 6, wherein at least one of a height, a shape, and a spacing of the plurality of substantially similar geometric objects is selected based on a desired volume of the unitary, substantially uniformly distributed transfer material.

12. The apparatus of claim 6, wherein the unitary, substantially uniformly distributed transfer material comprises a plurality of connecting elements to couple the plurality of substantially similar geometric objects to each other.

13. The apparatus of claim 12, wherein the plurality of connecting elements are arranged in a substantially repeating pattern.

14. A system, comprising:
   a wireless transceiver;
   a die including a circuit coupled to the wireless transceiver; and
   a unitary, substantially uniformly distributed transfer material forming a mesh and adjacent the die and coupled to a carrier material, wherein a plurality of elements included in the unitary, substantially uniformly distributed transfer material are distributed in a substantially repeating pattern.

15. The system of claim 14, further comprising:
a plurality of connecting elements to couple the plurality of elements included in the unitary, substantially uniformly distributed transfer material to each other.

16. The system of claim 14, wherein the substantially repeating pattern comprises a parallel pattern.

17. The system of claim 14, wherein the substantially repeating pattern comprises a grid pattern.

18. The system of claim 14, further comprising:
a heat dissipating element coupled to the unitary, substantially uniformly distributed transfer material.

19. A system, comprising:
a wireless transceiver;
a die including a circuit coupled to the wireless transceiver; and
a unitary, substantially uniformly distributed transfer material forming a mesh and adjacent the die and coupled to a carrier material, wherein the unitary, substantially uniformly distributed transfer material further comprises a plurality of substantially similar geometric objects distributed in a grid pattern.

20. The system of claim 19, wherein at least one of a height, a shape, and a spacing of a plurality of substantially similar geometric objects is selected based on a package stress associated with the die.

21. An apparatus, comprising:
a unitary, substantially uniformly distributed transfer material forming a mesh; and
a carrier material coupled to the unitary, substantially uniformly distributed transfer material, wherein the unitary, substantially uniformly distributed transfer material includes an array of solderable elements coupled to each other by a plurality of solderable connecting elements.

22. The apparatus of claim 21, wherein the array of solderable elements is at least partially embedded in the carrier material.

23. The apparatus of claim 21, wherein an average volume of each one of the plurality of solderable connecting elements is less than about one-half of a volume of an average size of each one of the array of solderable elements.

* * * * *